United States Patent [19]

Ohtani et al.

[11] Patent Number: 4,792,532
[45] Date of Patent: Dec. 20, 1988

[54] SEMICONDUCTOR DEVICE AND PROCESS FOR PRODUCING THE SAME, AND TAPE CARRIER USED IN SAID PROCESS

[75] Inventors: Hideya Ohtani, Aichi; Toshimitsu Momoi, Higashimurayama; Eiji Ooi, Kawagoe; Shuhei Sakuraba, Kodaira; Masayuki Morita, Tokyo; Yoshiaki Wakashima, Kawasaki, all of Japan

[73] Assignee: Hitachi, Ltd., Tokyo, Japan

[21] Appl. No.: 946,951

[22] Filed: Dec. 29, 1986

[30] Foreign Application Priority Data

Dec. 25, 1985 [JP] Japan .................. 60-290520

[51] Int. Cl.$^4$ .................................. H01L 23/48
[52] U.S. Cl. ..................... 437/206; 437/8; 437/247; 29/593; 357/10; 174/52.6; 206/330
[58] Field of Search ............... 437/209, 211, 220, 205, 437/206; 29/839, 835, 593; 357/68, 70; 174/85 FP, 52 P

[56] References Cited

U.S. PATENT DOCUMENTS

| 4,283,839 | 8/1981 | Gursky | 437/205 |
| 4,332,341 | 6/1982 | Minetti | 228/188 |
| 4,627,151 | 12/1986 | Mulholland et al. | 437/209 |
| 4,635,092 | 1/1987 | Yerman et al. | 29/839 |
| 4,689,875 | 9/1987 | Solstad | 437/211 |

OTHER PUBLICATIONS

"IC Jisso Gijutsu (IC Placment Technology)", Japan Electronics Association, K. K. Kogyo Chosa Kai, Jan. 14, 1980, pp. 103–115.

Primary Examiner—Brian E. Hearn
Assistant Examiner—Beverly A. Pawlikowski
Attorney, Agent, or Firm—Antonelli, Terry & Wands

[57] ABSTRACT

According to the present invention, a tape carrier is prepared which comprises a power trunk line including an electric connection as a branch of a power lead for each tape carrier unit and a ground trunk line having an electric connection as a branch of a ground lead for each tape carrier unit, the power and trunk lines being continuously formed along the longitudinal direction of the tape carrier, and a lead for a control signal for establishing an electric conduction along the longitudinal direction of the tape carrier via an aging wiring for semiconductor pellets to conduct a simultaneous multipoint (gang) bonding on the tape carrier. By mounting the semiconductor pellets having the aging wiring on the tape carrier, it is enabled to apply the power voltage and to supply the control signal to each of the plurality of the semiconductor pellets, and hence the operation test can be simultaneously conducted for the semiconductor pellets mounted on the tape carrier having an arbitrary length. This provision enables a plurality of semiconductor devices mounted on the tape carrier to be subjected to an aging, namely, a reliability test under a thermal environment and in the operating state, and hence an efficient reliability test can be achieved with an effect of the mass production. Consequently, a highly reliable semiconductor device can be provided.

9 Claims, 3 Drawing Sheets

SEMICONDUCTOR DEVICE AND PROCESS FOR PRODUCING THE SAME, AND TAPE CARRIER USED IN SAID PROCESS

BACKGROUND OF THE INVENTION

The present invention relates to a semiconductor device and a process for producing the same, and a tape carrier used in the process.

Among the semiconductors, there are semiconductors produced according to a so-called tape carrier system. Such a semiconductor device is produced by use of a tape carrier with techniques such as a wire bonding, the tape carrier having a plurality of leads (wiring pattern) with a predetermined shape formed thereon by use of, for example, a copper foil. The tape carrier is made of a tape (film) manufactured by use of an insulating material such as polyimide. Namely, an electrode of a semiconductor pellet in which an integrated circuit (IC) or a large-scale integrated circuit (LSI) is formed is bonded to an end of the lead by use of a simultaneous, multipoint bonding, namely, by the gang bonding, and thereafter the other end of the lead is cut off and is linked to a wiring electrode of a wiring board such as a printed circuit board, thereby manufacturing the semiconductor device.

The tape carrier is of a long size including a plurality of tape carrier units each formed by locating a lead pattern corresponding to an external lead of a semiconductor pellet on a tape manufactured by use of an insulation material. With the semiconductor pellet being bonded to the tape carrier unit, the tape carrier can be wound up on a reel for storage. As a consequence, the tape carrier system is a technology quite suitable for automation of the production of semiconductors, for example, watches and calculators, namely, so-called chip-on-board type semiconductor devices.

Incidentally, the tape carrier system is described in "IC JISSO GIJUTSU (IC PLACEMENT TECHNOLOGY)", Japan Electronics Association; K.K. Kogyo Chosa Kai, Jan. 14, 1980 (Page 107 and subsequent pages).

SUMMARY OF THE INVENTION

For the recent semiconductor devices, the higher reliability is required. To this end, the aging is achieved as a reliability test in which a semiconductor device is subjected to an electrical operation state under a thermal environment of the state where the device is heated.

However, the tape carrier system is attended with a difficulty that the aging of a semiconductor device cannot be easily accomplished. The inventor of the present invention has found that the problem is particularly considerable for a semiconductor which does not operate unless the power supply voltage associated with the electrical operation test is applied and the control signal is further supplied thereto.

The problem will be described in detail herebelow.

In a semiconductor device produced according to the tape carrier system, the lead thereof is formed with a copper foil having a thickness of about 35 $\mu$m and is hence soft and easy to deform. Consequently, the handling of the lead for each semiconductor is difficult, namely, cannot be easily effected. This is because such a semiconductor device produced according to the tape carrier system is compact; and hence a great difficulty appears when manually transporting the device or when mounting the device in a tester for the device test.

As described above, therefore, also in the aging test, the handling of the compact semiconductor device having the leads produced in the tape carrier system is accompanied by a considerable difficulty. Moreover, it is practically almost impossible in some cases to attach a terminal for the operation test to the thin-film lead which is soft and easy to deform and to perform for each compact semiconductor device an efficient aging test under a uniform, proper condition when a great number of such devices are to be tested.

Consequently, the operation test under a thermal environmental condition has not been conventionally accomplished hitherto, which makes it quite difficult to correctly detect a defective device or a semiconductor device having a latent defect.

It is therefore an object of the present invention to provide a semiconductor device for which an operation test under a thermal environment can be efficiently achieved.

Another object of the present invention is to provide a semiconductor device for which a large-quantity test can be efficiently accomplished.

Another object of the present invention is to provide a semiconductor device which has, after passing an appropriate test, a high reliability.

Still another object of the present invention is to provide a method for producing a semiconductor device for which a large-quantity test can be efficiently achieved.

Another object of the present invention is to provide a tape carrier capable of effectively accomplishing a large-quantity operation test.

Further another object of the present invention is to provide a technology enabling an aging of a semiconductor pellet for a tape carrier type semiconductor device.

These and other objects and the novel features of the present invention will be apparent from the following detailed description taken in conjunction with the accompanying drawings.

The representative features of the invention disclosed in this application can be briefly described as follows.

That is, a tape carrier is prepared which comprises a power trunk line including an electric connection as a branch of a power lead for each tape carrier unit and a ground trunk line having an electric connection as a branch of a ground lead for each tape carrier unit, the power and trunk lines being continuously formed along the longitudinal direction of the tape carrier, and a lead for a control signal for establishing an electric conduction along the longitudinal direction of the tape carrier via an aging wiring for semiconductor pellets to effect a simultaneous multipoint bonding on the tape carrier, the control signal lead being formed on the tape carrier. By mounting the semiconductor pellets having the aging wiring on the tape carrier, it is enabled to apply the power voltage and to supply the control signal to each of the plurality of the semiconductor pellets, and hence the operation test can be simultaneously conducted for the semiconductor pellets mounted on the tape carrier having an arbitrary length. This provision enables a plurality of semiconductor devices mounted on the tape carrier to be subjected to an aging, namely, a reliability test under a thermal environment and in the operating state, and hence an efficient reliability test can be achieved with an increased effect of the mass production. Consequently, a highly reliable semiconductor device can be provided.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1:
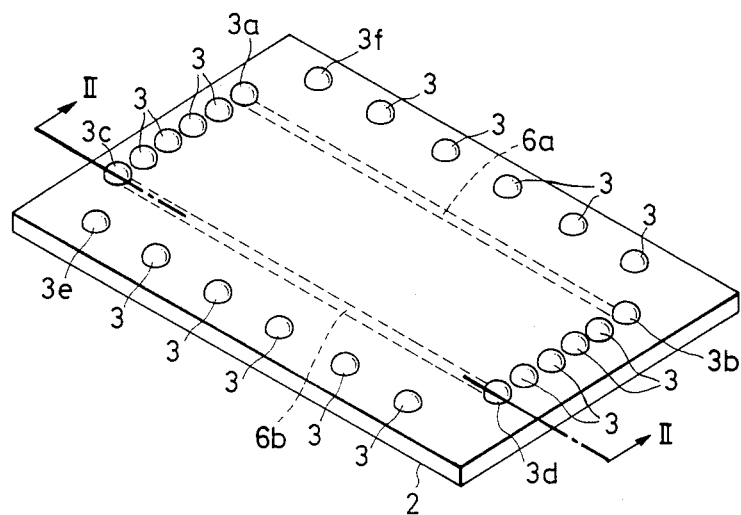
FIG. 1 is a perspective view of a semiconductor pellet incorporated into a semiconductor device as an embodiment of the present invention.
Figure 2:
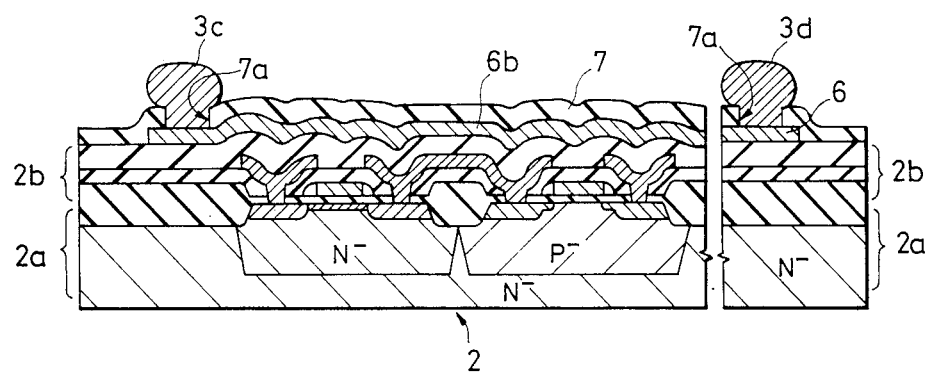
FIG. 2 is an enlarged cross-sectional view along a line II—II of the semiconductor pellet.
Figure 3:
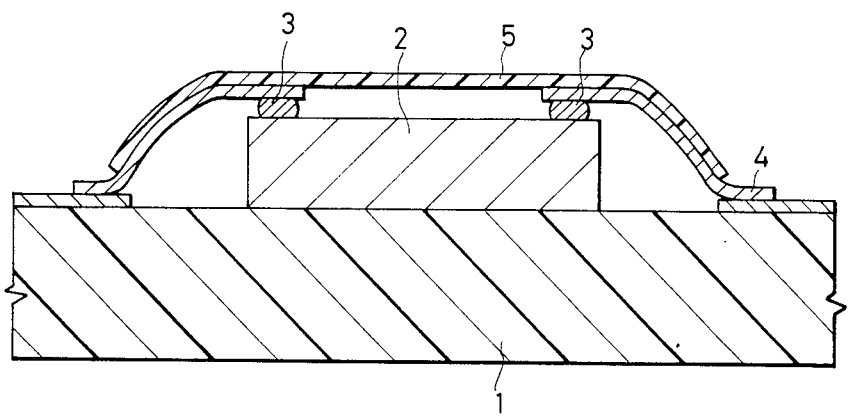
FIG. 3 is a schematic cross-sectional diagram showing a portion of the semiconductor device as the embodiment.
Figure 4:
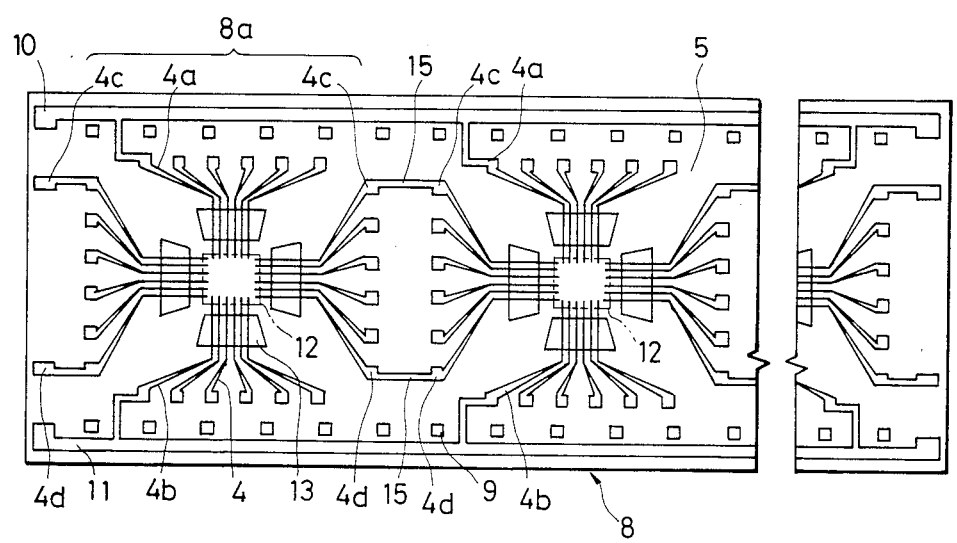
FIG. 4 is a plan view illustrating an outline of a tape carrier applied to the production of the semiconductor device as the embodiment.
Figure 5:
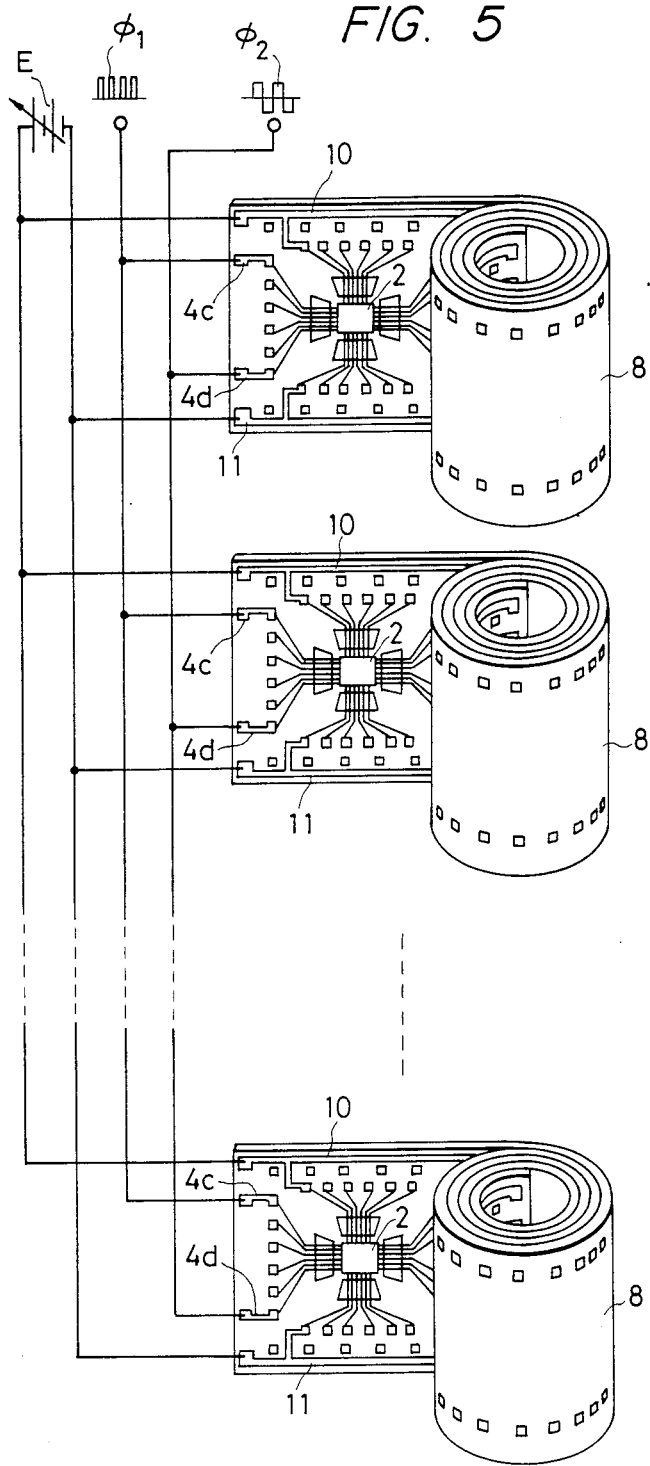
FIG. 5 is a schematic explanatory diagram demonstrating an aging of the semiconductor pellet.

FIG. 1 is a perspective view of the semiconductor pellet incorporated into the semiconductor device as an embodiment of the present invention, FIG. 2 is a cross-sectional view along a line II—II of the semiconductor pellet, and FIG. 3 is a cross-sectional diagram showing a portion of the semiconductor device as the embodiment. Furthermore, FIG. 4 is a plan view illustrating a tape carrier applied to the production of the semiconductor device as the embodiment, whereas FIG. 5 is an explanatory diagram demonstrating an aging of the semiconductor pellet.

The semiconductor device of the embodiment is so-called of a chip-on-board (COB) type. That is, referring to FIG. 3, a semiconductor pellet 2 is mounted on a wiring board 1 comprising a printed circuit board with the face of the pellet 2 up (in the face up state), and an electrode pad 3 of the semiconductor pellet 2 is electrically connected via a lead 4 to an electrode 1a, the lead 4 being formed with a copper foil having a thickness of about 35 μm. A polyimide film 5 is fixed to a portion of the lead 4.

In the semiconductor pellet 2 incorporated into the semiconductor device by use of the simultaneous multipoint bonding (gang bonding), a wiring 6 including a wiring 6a and a wiring 6b is formed between electric pads 3a and 3b and between electric pads 3c and 3d formed along two opposing edges of a plurality of electric pads 3 as shown in FIG. 1. The wirings 6a and 6b are utilized as the aging wirings in this embodiment.

FIG. 2 is a cross-sectional diagram illustrating the relationships between the electric pads 3c–3d and the aging wiring 6b. The aging wirings 6a and 6b are formed, like the ordinary internal wiring, with aluminum (Al) disposed beneath a passivation layer, and the electric pad 3 is formed to protrude into a hole portion 7a in the passivation layer. The electric pad 3 is of a bump electrode structure and can be formed, for example, in a 3-layer structure in which chromium (Cr), copper (Cu), and gold (Au) are sequentially fixed onto the aging wirings 6a and 6b. The wirings 6a and 6b may be configured in various structures. The wirings 6a and 6b may be simultaneously formed when manufacturing the multilayer wiring of the semiconductor pellet or may be formed in the different processes. If the wirings 6a and 6b are simultaneously formed together with the multilayer wiring, the multilayer internal wiring of two or three layers may be used for the formation of the aging wirings. The material of the wirings may be aluminum, polycrystalline silicon having a low resistance, or a refractory metal layer.

The semiconductor device of the present embodiment is produced by use of the tape carrier of FIG. 4. The tape carrier 8 includes as a base a longitudinal polyimide film 5 on which a plurality of tape carrier units 8a having a predetermined lead pattern to be applied to a semiconductor pellet are continuously formed in the direction to the right side of the diagram, the tape carrier 8 further including a wiring pattern formed thereon. On both sides in the transverse direction of the tape carrier 8, there are formed feed holes 9 with a fixed pitch along the entire film 5.

Moreover, in the film 5 located outside of the feed holes 9, a power trunk wiring 10 and a ground trunk wiring 11 are linearly and continuously formed along the longitudinal direction in the intermediate and lower sections of the diagram, respectively.

A semiconductor pellet mount section 12 is disposed at a central portion of the tape carrier unit 8a and a plurality of leads 4 each having an internal end are arranged in a predetermined shape on an internal periphery of the mount section 12. In addition, four through holes 13 are disposed on the external periphery of the mount section 12 so as to enclose the mount section 12, and each lead 4 is bridged to the holes 13.

Among the leads 4 extending from the mount section 12, the power lead 4a is branched from the power trunk line 10 and these components are formed in a unit as an electric wiring.

Moreover, among the leads 4 extending from the mount section 12, the ground lead 4b is branched from the ground trunk line 11 and these components are formed in a unit as an electric wiring. Consequently, when the semiconductor pellet 2 is fixed by use of the gang bonding on the chip carrier 8, the internal ends of the power leads 4a and the ground lead 4b, respectively can be fixed to the power electrode pad 3e and the ground electrode pad 3f of the semiconductor pellet 2, respectively. As a result, when a power supply E (e.g. see FIG. 5) is installed between the power trunk line and the ground trunk line 11 to apply a predetermined test voltage, the power voltage can be applied to all semiconductor pellets mounted on the tape carrier 8.

In addition, among the leads 4 arranged on the right and left sides of the mount section 12 for the tape carrier unit 8a, two leads located at the top and bottom are used as the control signal leads 4c and 4d. The other leads 4 are electrically disconnected between the adjacent tape carrier units, whereas the control signal leads 4c and 4d are electrically connected by use of a connection wiring 15 between the adjacent tape carrier units.

Since the semiconductor pellets 2 are fixed on the tape carrier 8 by the bonding, namely, the tape carrier leads 4 and the pad electrodes 3 of the semiconductor pellet are subjected to the gang bonding, the internal end of the control signal lead 4c and the internal end of the lead 4d can be fixed to the electric pad 3c or 3d and the electric pad 3a or 3d, respectively for each tape carrier unit 8. As a consequence, the control signal leads 4c and 4d formed in the tape carrier unit 8a are electrically connected between the tape carrier units through the aging wirings 6a and 6b formed on the semiconductor pellet 2. As a result, by using the semiconductor pellet of the present invention also for the control signal lead, the electric conduction is established through the entire tape carrier 8. Consequently, when the control signals $\phi 1$ and $\phi 2$ are applied to the control signal leads 4c and 4d, respectively, the operation test can be conducted in a state where the control signals are simultaneously applied to the semiconductor pellets mounted over the tape carrier 8. The aging wirings 6a and 6b can be subjected to a disconnect processing if necessary.

As described above, since the semiconductor pellets 2 are mounted on the tape carrier 8, the power voltage E can be applied to all the semiconductor pellets 2 on the overall tape carrier 8, thereby effecting the conduction test with the control signals $\phi 1$ and $\phi 2$ being supplied thereto. As shown in FIG. 5, therefore, the conduction test can be achieved so that a plurality of pellets are simultaneously subjected to the aging by installing a plurality of tape carriers each being rolled up as a volume in a compact state into a thermostatic bath.

The semiconductor device of the embodiment is produced as follows. First of all, a silicon wafer in the shape of a wafer is processed through the thermal diffusion, the oxide film creation, and the CVD film creation so as to form a semiconductor IC 2a and a multilayer wiring layer 2b containing aging wirings. And then a probe test is conducted on the wafer to determine whether or not the aging wirings are acceptable. Next, the wafer is divided by the dicing process to obtain semiconductor pellets. Thereafter, the aging is achieved for the tape carrier 8 on which the semiconductor pellets 2 are fixed by the gang bonding, and then the probe test is executed for each tape carrier unit 8a to select the acceptable products. For the tape carrier unit 8a on which the acceptable semiconductor pellet is mounted, the lead 4 is cut off at a position of the hole 13 disposed in the film of FIG. 4. The unnecessary portion of the tape carrier is then removed, thereby obtaining an acceptable product in which the semiconductor pellet 2 and the lead 4 fixed thereto are formed in a unit. Thereafter, a top end of the lead 4 fixed to the separated semiconductor pellet 2 is bonded with the electrode 1a of the wiring board 1, thereby completing the production of the semiconductor.

Since the semiconductor device of this embodiment thus produced includes a semiconductor pellet 2 undergone such a sufficient aging as described above and then mounted on the device, a quite high reliability can be developed without any defects remaining in the semiconductor device.

In addition, with the tape carrier 8, the probe test can be conducted on the semiconductor pellet 2 of each tape carrier unit 8a while executing the aging process on the semiconductor pellet 2 or immediately after the aging if the control signal leads 4c and 4d of the adjacent tape carrier unit are cut off at the connecting portion 15. Consequently, a latent defect which is restored to the normal state when the product is left to stand for a certain period of time after the aging is conducted and which cannot be therefore detected can be effectively detected because the probe test is achieved immediately after the aging is conducted.

As an aging method, it can be considered that a portion of the tape carrier is cut away and for the semiconductor pellet 2 mounted on the separated portion, the electric connections such as for the power supply, grounding potential, and control signals are established for each aging process. Such troublesome procedures are not required when the tape carrier 8 of the embodiment is used. Since the simultaneous aging is possible for all the semiconductor pellets over the entire tape carrier 8, the long-period and large-quantity aging is enabled during the same processing time as compared with the case described above. Consequently, the reliability of the semiconductor device can be greatly improved.

Although the present invention has been concretely described with reference to an embodiment of the present invention, it is not restricted by the embodiment. The embodiment can be modified in various fashions without departing from the scope and spirit of the present invention.

As the test wiring 6 to be formed simultaneously with the creation of the multilayer wiring layer 2b of the semiconductor pellet 2 or in a separate process, it is only required to disposed a wiring structure establishing a short circuit between the control signal pad electrodes 3a and 3b or between the electrodes 3c and 3d. As a consequence, a jumper wire other than the wirings associated with the multilayer wiring layer may be used for the short-circuit wiring between the pads. This jumper wire has an effect that the operation to disconnect the wire when necessary is facilitated.

For example, although the power trunk line and the ground trunk line are formed in the marginal film region outside the feed holes, they are not restricted by the configuration, namely, the other marginal portion of the film region may also be used.

Moreover, the tape carrier includes two control signal leads located at the top and the bottom of the diagram; however, the number of the control signal leads, the locations for the leads, and the shape pattern are not restricted by the embodiment. Consequently, the aging wirings of the semiconductor pellets to which the control signal leads are connected are similarly not restricted by the embodiment.

Furthermore, the shape of the film for each tape carrier unit and the lead pattern formed thereon are naturally not restricted by the embodiment.

The description of the invention has been made with reference to the utilization field as the background of the invention mainly realized by the inventors, namely, to a case where the invention is applied to the so-called COB-type semiconductor; however, the present invention is not restricted by this case but it is a technology which can also be applied to any semiconductor devices using the tape carrier system for the production thereof regardless of the external shape of the package or the like.

As noted previously, in recent semiconductor devices, the higher reliability is required. To this end, the aging is achieved as a reliability test in which a semiconductor device is subjected to an electrical operation state under a thermal environment of the state where the device is heated.

According to the present invention, even for the semiconductor device associated with the tape carrier system, the aging of the semiconductor device can be easily achieved, and hence the electrical operation test in which the power voltage is applied to the device and further the control signals are applied thereto can be achieved as the aging for the semiconductor device in the ordinary operating state.

In addition, according to the present invention, a plurality of semiconductor pellets in the tape carrier state can be subjected to various tests such as the aging test and the operation test under a thermal environment in a state where each semiconductor pellet is not manually handled. Consequently, the semiconductor device of the present invention, namely, the Tape Automated Bonding (TAB) product allows the large-quantity test which has been conventionally difficult to be automatically achieved without any human intervention, which enables the test processes to be quite efficient.

The semiconductor device of the present invention allows the operation test to be efficiently accomplished under a thermal environment.

The semiconductor device of the present invention enables the large-quantity test to be efficiently achieved.

According to the present invention, there is provided a highly reliable semiconductor device after a proper test is finished.

According to the present invention, there is provided a method for manufacturing a semiconductor device capable of efficiently conducting the large-quantity test.

According to the present invention, there is provided a tape carrier capable of efficiently accomplishing the large-quantity test.

The effect of the present invention is as follows.

(1) A tape carrier is prepared which comprises a power trunk line including an electric connection as a branch of a power lead for each tape carrier unit and a ground trunk line having an electric connection as a branch of a ground lead for each tape carrier, the power and trunk lines being continuously formed along the longitudinal direction, and a lead for a control signal for establishing an electric conduction along the longitudinal direction via an aging wiring for semiconductor pellets to be mounted. By mounting the semiconductor pellets having the aging wiring on the tape carrier, it is enabled to apply the power voltage and to supply the control signal to each of the plurality of the semiconductor pellets, and hence the conduction (operation) test can be simultaneously conducted for the semiconductor pellets mounted on the tape carrier having an arbitrary length.

(2) The operation (conduction) test is conducted by heating the device to a predetermined temperature, and hence the aging can be simultaneously effected for all semiconductor pellets mounted on the tape carrier having an arbitrary length.

(3) Since the aging can be simultaneously conducted for a great quantity of semiconductor pellets according to (2) above, the large-quantity test can be efficiently achieved within a predetermined period of time, thereby lowering the cost of the tape carrier type semiconductor device.

(4) For the similar reason to that of (3) above, the large-quantity test can be efficiently effected and the aging can be achieved for a plurality of semiconductor pellets in the compact state; as a result, a long-time aging is enabled and the reliability of the semiconductor device is improved. Incidentally, it is noted that the actual aging time for "long-time aging" depends on the particular circumstances and device requirements and can vary extensively. For example, a typical range would be from as short a time as two hours to as long a time as 20 days.

(5) According to (2) above, by disconnecting the control signal lead between the adjacent tape carrier units during or immediately after the aging on a semiconductor pellet, the probe check can be executed on the semiconductor pellet for each tape carrier unit immediately after the aging. Consequently, a defect which is restored with a lapse of time can be detected by the probe check, and hence a highly-reliable semiconductor device can be provided for the user.

(6) Based on (1)-(5) above, a low-priced tape carrier type semiconductor device having a high reliability can be supplied to the user.

What is claimed is:

1. A method for producing a semiconductor device comprising:
   preparing a tape carrier including an insulation tape having a longitudinal shape on which a plurality of tape carrier units each having a wiring pattern with a plurality of leads are formed with a constant interval therebetween, control signal input leads of adjacent tape carrier units being linked via a short circuit by use of a conductive lead, at least a trunk lead being disposed along an entire length of the tape, and each lead branched from the trunk lead being linked by a short circuit to a lead of a corresponding tape carrier unit;
   preparing semiconductor pellets, each pellet having at least a control signal input pad electrode formed in the vicinity of one edge of each said semiconductor pellet and at least a pad electrode formed in the vicinity of another edge opposing said one edge;
   effecting a simultaneous multipoint bonding, by use of a wireless bonding, between a plurality of leads of the tape carrier and a plurality of pad electrodes of each of the semiconductor pellets, after preparing the tape carrier and after preparing the semiconductor pellets; and
   effecting an operation test on at least one of the semiconductor pellets in a state where a control signal is applied to the control signal input lead of the tape carrier and a power voltage is applied to the trunk lead, after effecting the simultaneous multipoint bonding.

2. A method according to claim 1 wherein during the operation test, a test in an environment where the device is heated, so as to conduct an aging test, is simultaneously effected on the at least one semiconductor pellet.

3. A method according to claim 1 wherein the semiconductor pellet includes a semiconductor IC device formed thereon.

4. A method according to claim 1 wherein each said semiconductor pellet is prepared so as to include aging wiring, the aging wiring extending along the semiconductor pellet between pad electrodes at opposed edges of the semiconductor pellet.

5. A method according to claim 4 wherein the simultaneous multipoint bonding includes bonding the control signal input lead of the tape carrier to the control signal input pad electrode of a respective semiconductor pellet, and wherein said aging wiring is a short circuit wiring connecting said control signal input pad electrode and a control signal pad electrode, on opposed edges of each semiconductor pellet.

6. A method according to claim 1 wherein said tape carrier is comprised of a polyimide film having conductive metal leads, as said plurality of leads, thereon.

7. A method according to claim 1 wherein said operation test is simultaneously effected on a plurality of the semiconductor pellets after effecting the simultaneous multipoint bonding.

8. A method according to claim 2 wherein a probe test is conducted on each semiconductor pellet simultaneously while affecting said test in an environment where the pellet is heated.

9. A method according to claim 2 wherein a probe test is conducted on each semiconductor pellet immediately after effecting the test in an environment where the pellet is heated.

* * * * *